United States Patent
Halli et al.

(10) Patent No.: US 11,630,492 B2
(45) Date of Patent: Apr. 18, 2023

(54) ELECTRONIC DEVICE COMPRISING A MOTHER BOARD AND A RISER CARD

(71) Applicant: Atos Global IT Solutions and Services Private Limited, Navi Mumbai (IN)

(72) Inventors: Sanjayakumar Halli, Gadag (IN); Prakash Nagaraja, Bangalore (IN); Sriprada Adiga, Bangalore (IN); Shubham Kumbhar, Bangalore (IN); Kumar Avinash, Bangalore (IN); Madhu K Sharma, Bantwal taluk (IN); Pravin Kumar Thakur, Bangalore (IN)

(73) Assignee: BULL SAS, Les Clayes sous Bois (FR)

( * ) Notice: Subject to any disclaimer, the term of this patent is extended or adjusted under 35 U.S.C. 154(b) by 0 days.

(21) Appl. No.: 17/503,528

(22) Filed: Oct. 18, 2021

(65) Prior Publication Data
US 2022/0129050 A1 Apr. 28, 2022

(30) Foreign Application Priority Data
Oct. 22, 2020 (EP) .................................. 20203322

(51) Int. Cl.
*G06F 1/18* (2006.01)
*H05K 7/14* (2006.01)
(52) U.S. Cl.
CPC ........... *G06F 1/185* (2013.01); *H05K 7/1429* (2013.01)

(58) Field of Classification Search
CPC ........ G06F 1/185; G06F 1/186; G06F 13/409; H05K 7/1429; H05K 7/1445; H05K 1/117; H05K 2201/09954; H05K 1/14
See application file for complete search history.

(56) References Cited

U.S. PATENT DOCUMENTS

| | | | |
|---|---|---|---|
| 6,396,703 B1 | 5/2002 | White | |
| 6,906,929 B2* | 6/2005 | Chiu | G06F 1/185 710/301 |
| 8,898,362 B2* | 11/2014 | Sun | G06F 13/4063 361/792 |
| 2006/0109636 A1 | 5/2006 | Hood et al. | |
| 2007/0101037 A1* | 5/2007 | Lin | G06F 1/185 710/301 |
| 2013/0054949 A1* | 2/2013 | Berke | G11C 5/04 713/2 |

OTHER PUBLICATIONS

European Search Report issued in EP20203322, dated Mar. 31, 2021 (10 pages).

* cited by examiner

*Primary Examiner* — James Wu
(74) *Attorney, Agent, or Firm* — Arc IP Law, PC; Joseph J. Mayo

(57) ABSTRACT

A mother board with a central processing unit and two riser slots configured to cooperate with one riser card for connecting two expansion cards to the mother board. The first riser slot and the second riser slot may be connected by metal traces to the central processing unit, and the two riser slots may be spaced apart by a distance greater than 8 cm.

16 Claims, 5 Drawing Sheets

ELECTRONIC DEVICE COMPRISING A MOTHER BOARD AND A RISER CARD

This application claims priority to European Patent Application Number 20203322.1, filed 22 Oct. 2020, the specification of which is hereby incorporated herein by reference.

BACKGROUND OF THE INVENTION

Field of the Invention

The present invention relates to an electronic device comprising a mother board and expansion cards connected to the mother board through a riser card.

Description of the Related Art

A datacenter comprises several electronic devices, such as servers, switches and routers, to organize, process and store data. A datacenter also comprises several racks, called "clusters", arranged in rows within the datacenter and configured to house said devices. A rack defines vertically stacked housings having a predetermined height U. U is the standard unit of measure for designating the vertical usable space for each housing of racks. 1 U is equal to 1.75 inches (4,445 cm).

As represented in FIG. 1, an electronic device 101 comprises, within a main body 110, a horizontal mother board 102 with several components (central processing unit 121, connectors 122, memory slots 123, etc.). The height of the main body 110 is a multiple of U, for example 1U, 2 U or 3 U. In some circumstances, a device 101 comprises expansion cards connected to the mother board 102, for example, a PCIe board (Peripheral Component Interconnect Express). Traditionally, the expansion board is mounted orthogonally to the mother board 102.

Due to height constrains in 1 U and 2 U electronic devices 101, the perpendicular placement of expansion cards becomes a problem, especially when the expansion card is an FHFL card (Full Height Full Length). To solve this issue, as represented in FIG. 1, it is known to use a riser card 105 between the mother board 102 and the expansion cards 131, 132. The mother board 102 and the expansion cards 131, 132 extends horizontally and the riser card 105 extends vertically to connect the expansion cards 131, 132 to the motherboard 102 as represented in FIG. 1.

As represented in FIG. 2, a riser card 105 is flat and has a rectangular shape 150 and extends longitudinally. The riser card 105 comprises two expansion slots 151, 152 configured to connect with edge connectors of the expansion cards 131, 132. The riser card 105 comprises also one main edge connector 153. To limit the height of the riser card 105, the slots 151, 152 are located on one lateral portion of the riser card 105 whereas the main edge connector 153 is located on the other lateral portion. The main edge connector 153 is connected to the expansion slots 151, 152 through metal traces (not represented).

To receive the riser card 105, as represented in FIGS. 3 and 4, the mother board 102 comprises a main riser slot 124 configured to cooperate with the main edge connector 153 of the riser card 105, for example, a 280 Pin×32 Lanes riser slot 124. As represented in FIG. 4, the main riser slot 124 is connected to the central processing unit 121 through metal traces L3. In certain configuration, due to the presence of memory slots 123 near and parallel to the main riser slot 124, especially DIMM slots (Dual In-Line Memory Module), the metal traces L3 cannot be routed directly along straight lines from the main riser slot 124 to the central processing unit 121. Due to this reason the routing must be done along the periphery of the memory slots 123. The length of the metal traces L3 is therefore increased. The specification PCIe Generation 5 requires that the total metal trace between the edge connector of the expansion card 131, 132 and the central processing unit 121 is below 13 inches (33.02 cm). Because of the memory slots 123, the total metal trace is over this threshold.

In order to eliminate this drawback, one solution would be to move the memory slots 123 on another location on the mother board 102. However, for industrial reasons, this solution is not possible.

An objective of the present invention is to provide an electronic device comprising a mother board and a riser card which respects the specification PCIe Generation 5.

BRIEF SUMMARY OF THE INVENTION

The invention relates to a mother board for an electronic device, the mother board comprising at least one central processing unit and a first riser slot and a second riser slot, said slots being configured to cooperate with one riser card for connecting two expansion cards to the mother board, the first riser slot and the second riser slot being connected by metal traces to the central processing unit, the first riser slot and the second riser slot being spaced apart by a distance greater than 8 cm.

Thanks to one or more embodiments of the invention, it is provided two riser slots which are spaced apart so that the metal traces to the central processing unit are shorter. Two riser slots offer flexibility for the metal traces routing in comparison to a single riser slot. Memory slots can be easily avoided without increasing the length of metal traces. Advantageously, it is possible to package two FHFL expansion cards in a 1 U formfactor device. The unused space located on the rear of the riser card is advantageously used. In one or more embodiments, the spacing distance corresponds to the length of an expansion slot.

In one or more embodiments, the mother board comprises a power or side band signal slot. The power or side band signal slot, the first riser slot and the second riser slot are configured to cooperate with said riser card. There may be for example only three slots for connecting to a riser card.

According to an aspect of the invention, the first riser slot is closer to the central processing unit than the second riser slot. The first riser slot comprises more pins than the second riser slot. The length of the metal traces is reduced optimally.

There may be at least one memory slot is located between the first riser slot and the processing unit. The number of memory slots may be for example over 2 and less than 5.

According to an aspect of the invention, the first riser slot comprises more than 100 pins, for example, 140 pins.

According to another aspect of the invention, the second riser slot comprises less than 100 pins, for example, 84 pins.

One or more embodiments of the invention relate also to a riser card configured to be connected to a mother board and to two expansion cards, the riser card comprising:

A printed circuit board having a rectangular shape extending longitudinally along an axis and vertically along an axis, A first expansion slot configured to connect to an expansion card A second expansion slot configured to connect to an expansion card A first edge connector connected by metal traces at least to one of the expansion slots A second edge connector connected by metal traces at least to one of the expansion slots The first edge connector and the second edge connector being spaced apart by a distance greater than 8 cm.

Thanks to one or more embodiments of the invention, it is provided two edge connectors which are spaced apart so that the metal traces to the central processing unit are shorter. Besides, the length of the metal traces is limited in the printed circuit board, two edge connectors offer more flexibility for the metal traces routing in comparison to a single edge connector. The length of the metal traces in the printed circuit board is reduced.

The expansion slots may be located between the first edge connector and the second edge connector along the X axis. Such an arrangement allows decreasing the length of the metal traces which are split between the edge connectors located on the left and on the right of the expansion slots.

In one or more embodiments, the first edge connector is longer than the second edge connector.

In one or more embodiments, the riser card comprises a power edge connector located next to the first edge connector. The power connection is located on the opposite side of the second edge connector in order to limit the length of the metal traces of the second edge connector. In one or more embodiments, the expansion slots are aligned vertically. In one or more embodiments, the riser card has a height of 1 U or 2 U, for example, 1 U.

One or more embodiments of the invention relate also to an electronic device comprising a mother board according to the invention and at least one riser card according to the invention, the first edge connector and the second edge connector of the riser card being respectively plugged into the first riser slot and the second riser slot of the mother board. In one or more embodiments, the electronic device comprises at least an expansion card mounted in one of the expansion slots of the riser card.

In one or more embodiments, the electronic device is configured to be mounted in a housing of a rack. For example, the electronic device may have a height of 1 U or 2 U.

One or more embodiments of the invention relate also to a process for mounting an electronic device according to invention, the process comprising the following step: Plugging the first edge connector and the second edge connector of the riser card into the first riser slot and the second riser slot of the mother board respectively. The mounting is easy and fast for the operator.

BRIEF DESCRIPTION OF THE DRAWINGS

The invention will be better understood by reading the description that follows, only given as an example, and by referring to the appended figures in which.

It should be noted that the figures set out illustrative embodiments of the invention in a detailed manner to implement the invention, said figures obviously being able to serve to better illustrate the invention if need be.

DETAILED DESCRIPTION OF THE INVENTION

A datacenter comprises several racks, called "clusters", arranged in rows within the datacenter and configured to house electronic devices. A rack defines vertically stacked housings having a predetermined height U. U is the standard unit of measure for designating the vertical usable space for each housing of racks. 1 U is equal to 1.75 inches (4,445 cm).

Figure 1:
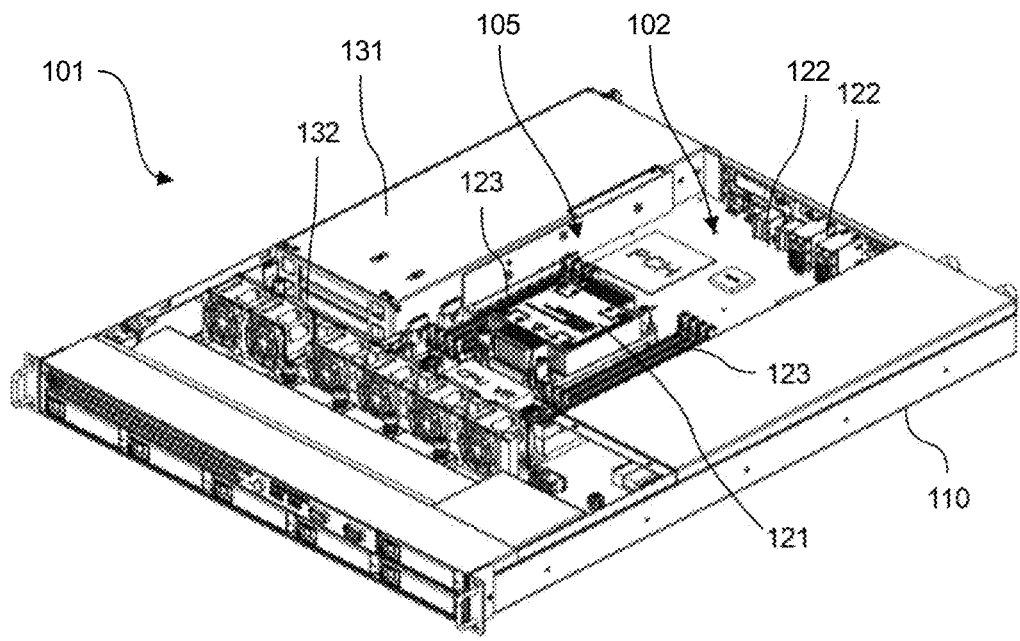
FIG. 1 is a perspective view of an electronic device according to prior art.
Figure 2:
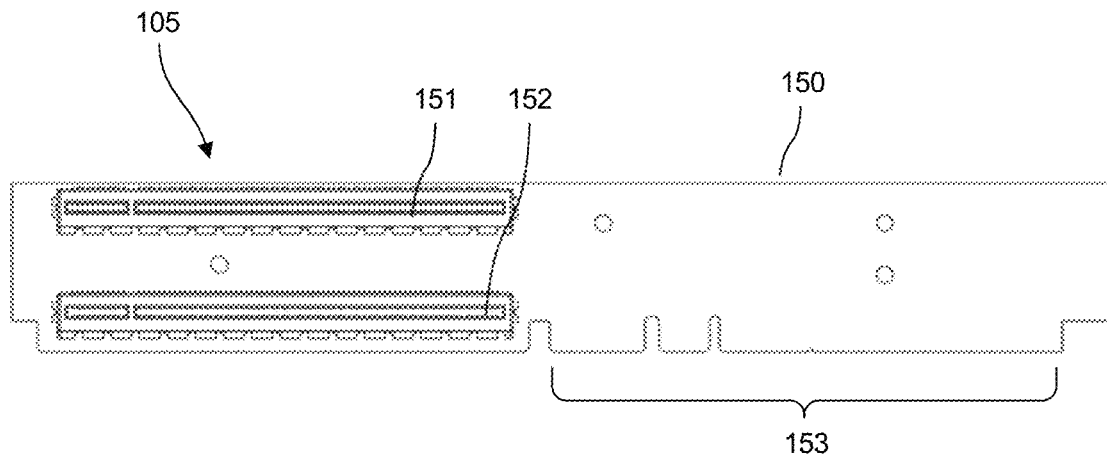
FIG. 2 is a front view of a riser card according to prior art.
Figure 3:
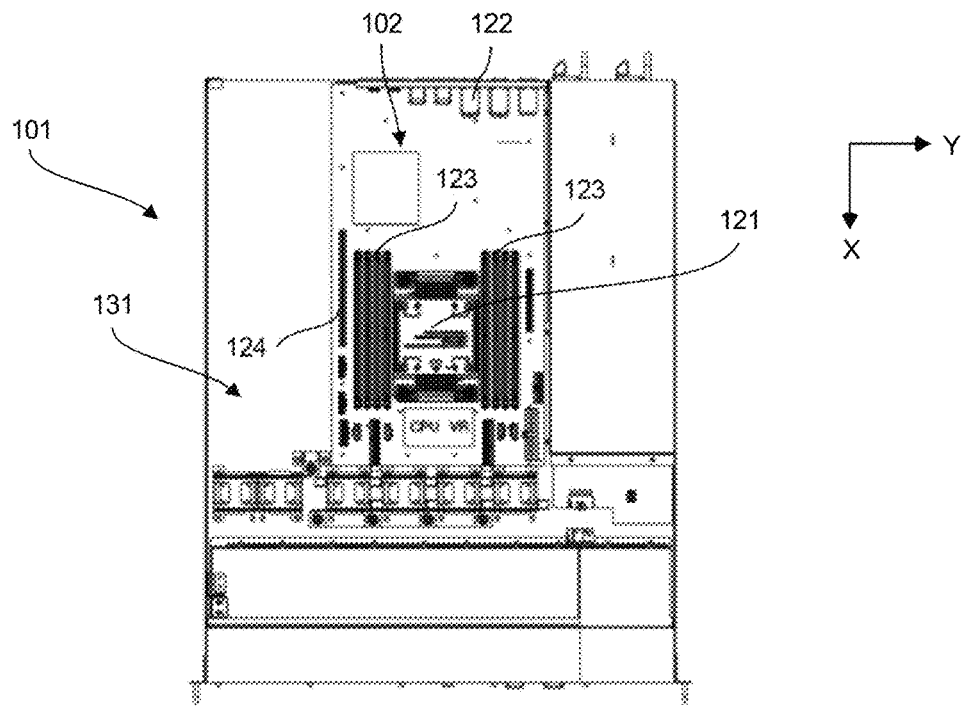
FIG. 3 is a top view of a mother board of the electronic device according to prior art.
Figure 4:
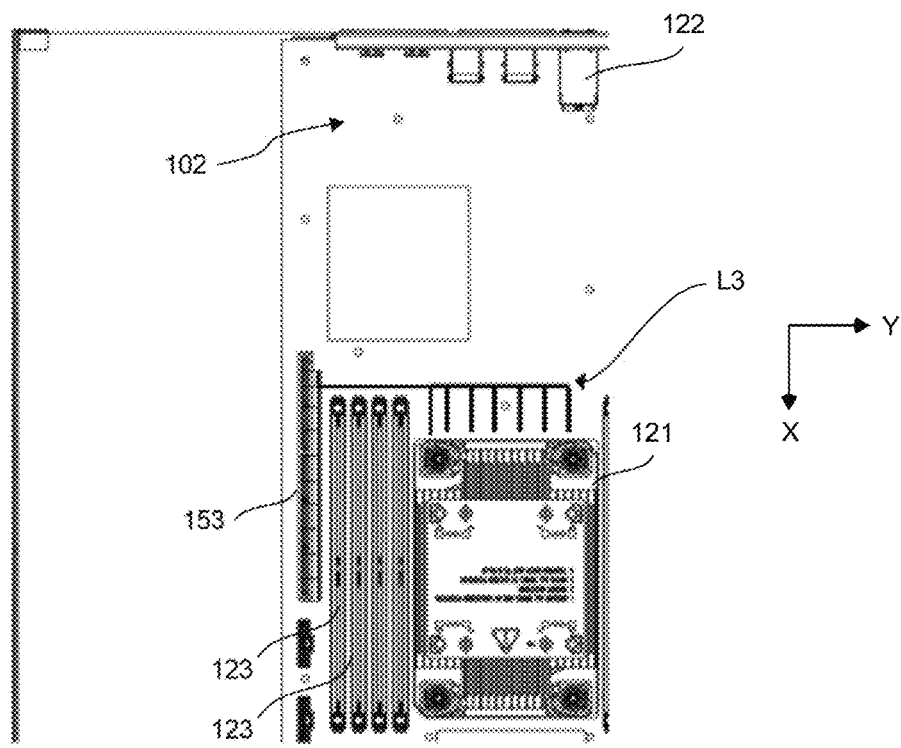
FIG. 4 represents a zoom of the metal traces of the mother board of FIG. 3.
Figure 5:
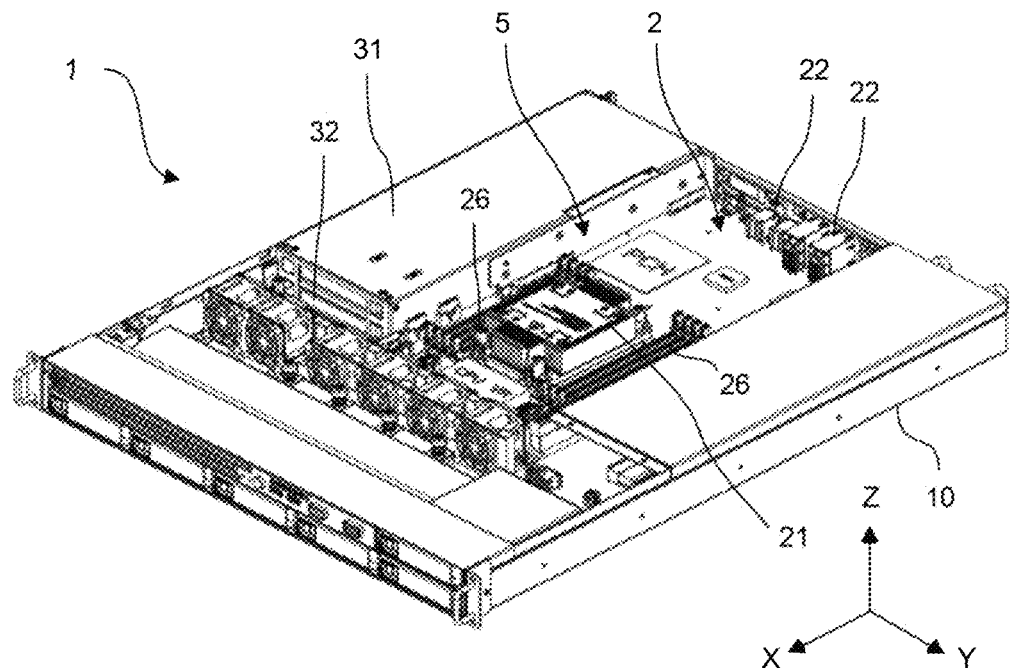
FIG. 5 is a perspective view of an electronic device according to an embodiment of the invention.

As illustrated in FIG. 5, an embodiment of the invention will be presented for an electronic device 1 comprising a mother board 2 and two expansion cards 31, 32 connected to the mother board 2 through a riser card 5. In this example, the device 1 is a server but can be of a different type (router, switch, etc.). The device 1 comprises a housing 10 in which are mounted the mother board 2 and the cards 31, 32, 5. The device 1 is configured to be mounted in a housing of a rack. In this example, the height of the housing 10 is equal to 1 U or 2 U which increases complexity. The electronic device 1 is a short form factor. In this example, the two expansion cards 31, 32 are PCIe cards housed in a mechanical chassis.

The electronic device 1 will be presented in a referential (X, Y, Z) in which the X axis extends longitudinally from the rear to the front, the Y axis extends laterally from the left to the right and the Z axis extends vertically from the bottom to the top.

Figure 7:
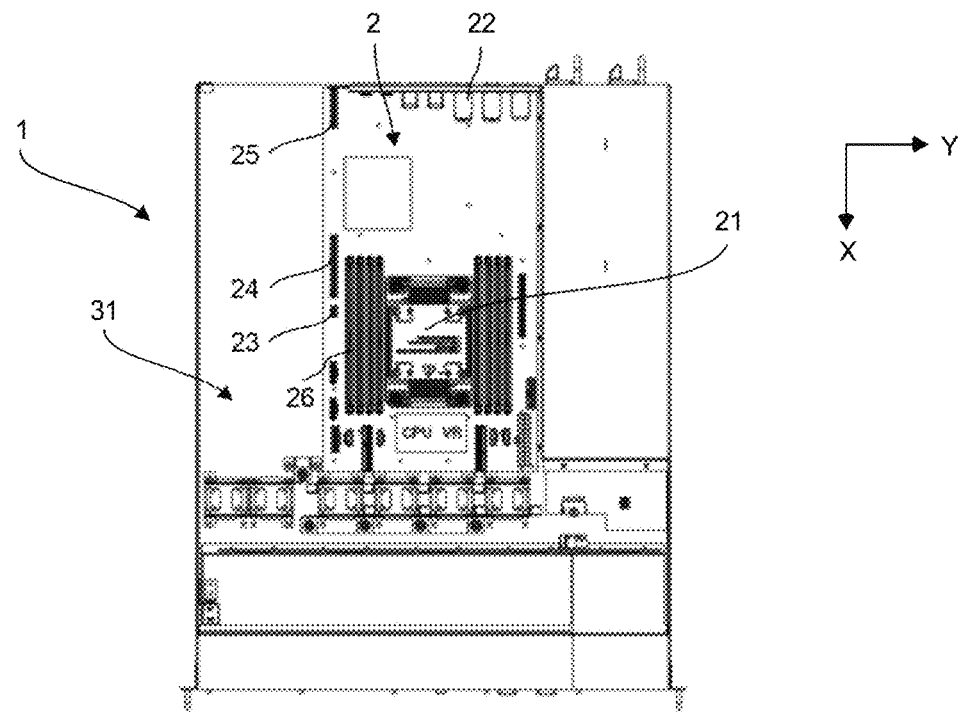
FIG. 7 is a top view of a mother board of the electronic device according to an embodiment of the invention.
Figure 8:
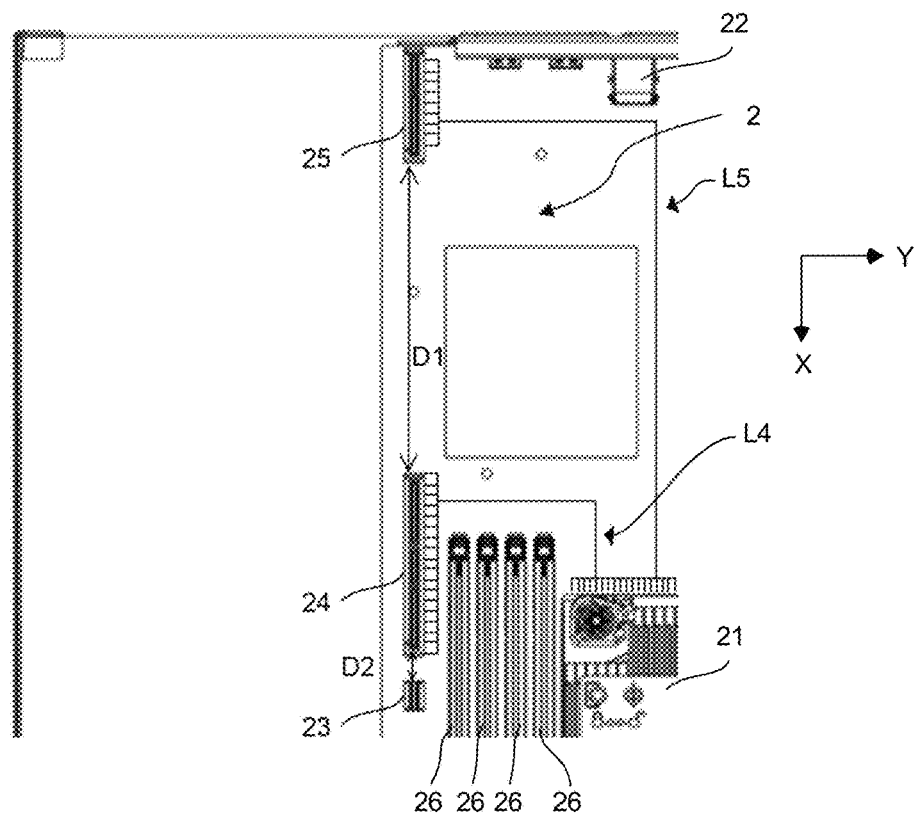
FIG. 8 represents a zoom of the metal traces of the mother board of FIG. 7.

A mother board 2 according to an embodiment of the invention will be presented in relation with FIGS. 5, 7 and 8.

The mother board 2 comprises a central processing unit 21 having one or several processors. The mother board 2 comprises rear connectors 22 for the communication and power when the device 1 is mounted in a rack.

The mother board 2 comprises also memory slots 26, more particularly, DIMM slots (Dual In-Line Memory Module). In this example, 4 memory slots 26 are located on each side of the central processing unit 21.

According to one or more embodiments of the invention, the mother board 2 comprises a power or side band signal slot 23, a first riser slot 24 and a second riser slot 25. Said slots 23, 24, 25 are configured to cooperate with one riser card 5 for connecting two expansion cards 31, 32 to the mother board 2.

As represented in FIG. 8, the power slot or side band signal slot 23, the first riser slot 24 and the second riser slot 25 are aligned along the X axis from the front to the rear. The first riser slot 24 and the second riser slot 25 are connected by metal traces L4, L5 to the central processing unit 21 in order to exchange data between the expansion cards 31, 32 and the mother board 2 through the riser card 5. The power or side band signal slot 23 is connected to power lines of the mother board 2. In this example, each metal trace consists of a flat, narrow part of the copper foil that remains after etching.

According to one or more embodiments of the invention, the first riser slot 24 and the second riser slot 25 are spaced apart by a distance D1 greater than 8 cm. In one or more embodiments, the distance D1 is comprised between 9 cm and 11 cm, for example, equal to 10 cm.

On contrary to a traditional mother board which has only one single riser slot, the present mother board 2 comprises at least two riser slots 24, 25 which are spaced apart in order to limit the length of the metal traces L4, L5. The second riser slot 25 is located at a distance from the memory slots 26 and doesn't require metal traces to be routed around the memory slots 26. Besides, as it will be seen later, the metal traces on the riser board 5 are also shorter.

Since the total of metal traces are shortened, each expansion card 31, 32 can respect the PCIe GEN5 specification which is advantageous. For such a specification, the maximum length allowed is 13 inches total. In the mother board 2, the length of the trace from the central processing unit 21 the second riser slot 25 is less than 7 inches. Only minor modifications of the mother board 2 are required in order to respect the specification.

In this example, the first riser slot 24 is spaced apart from the power slot or side band signal slot 23 by a distance D2 comprised between 0.6 and 0.8 cm. It allows better routing and bifurcating the signal and power lanes. The power slot or side band signal slot 23 is for example as close as possible to the front of the mother board 2.

As represented in FIG. 7, the first riser slot 24 is closer to the central processing unit 21 than the second riser slot 25 and the first riser slot 24 comprises more pins than the second riser slot 25. Therefore, more metal traces (connection) are defined for the first riser slot 24 to take advantage of the proximity between the first riser slot 24 and the central processing unit 21. When the routing of the metal traces L4 around the memory slots 26 is too long, the second riser slot 25 is used. The number of pins for each slot 24, 25 is predetermined in order to limit the length of the metal traces L4, L5 optimally.

In one or more embodiments, the first riser slot 24 comprises more than 100 pins, for example, 140 pins. In this example, the first riser slot 24 is a 140 pins×22 lanes. In one or more embodiments, the second riser slot 25 comprises less than 100 pins, for example, 84 pins. In this example, the second riser slot 25 is a 84 pins×10 lanes.

Figure 6:
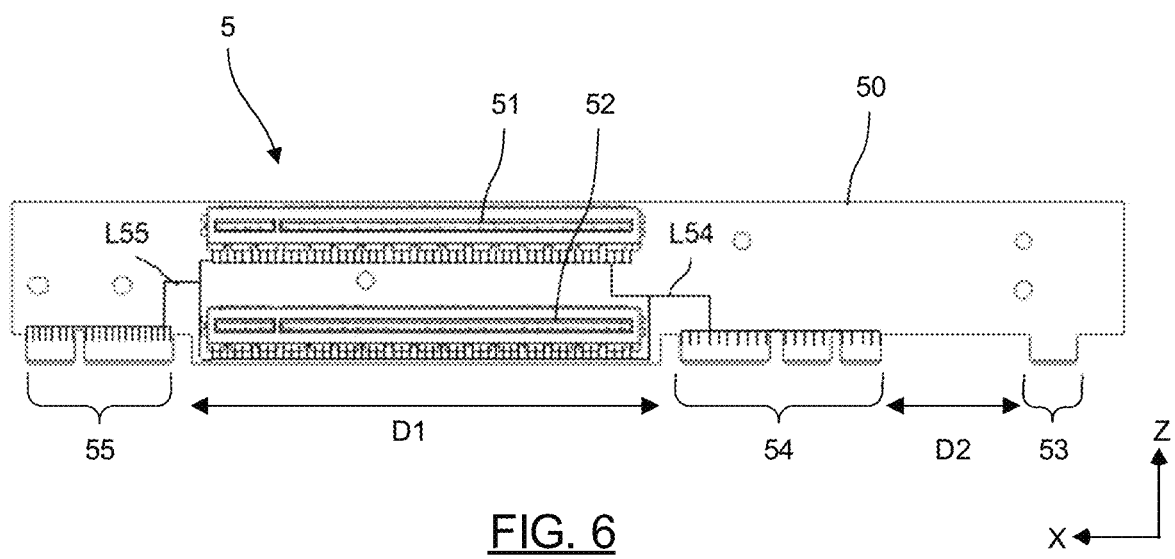
FIG. 6 is a front view of a riser card according to an embodiment of the invention.

A riser card 5 according to an embodiment of the invention is represented in FIG. 6. The riser card 5 is configured to be connected to the mother board 2 and to the two expansion cards 31, 32.

As represented in FIG. 6, the riser card 5 comprises a printed circuit board 50 having a substantially rectangular shape extending longitudinally along the X axis and vertically along an Z axis. For sake of clarity, the axes are defined when the riser card 5 is mounted.

The riser card 5 comprises a first expansion slot 51 configured to connect to the first expansion card 31, a second expansion slot 52 configured to connect to the second expansion card 32. In one or more embodiments, the expansions slots 51, 52 are PCIe (Peripheral Component Interconnect Express). The expansions slots 51, 52 are aligned vertically along the Z axis so that the expansion cards 31, 32 can be connected in a similar way than in the prior art. There is advantageously no need to modify the position of the expansion cards 31, 32 in the device 1.

The height of the riser card 5 may be for example equal to 1 U. Such a compact riser card 5 requires a high compacity.

As represented in FIG. 6, the riser card 5 also comprises:
A power or side band signal edge connector 53, for example 56 pins, connected by metal traces to both expansion slots 51, 52,
a first edge connector 54 connected by metal traces L54 at least to one of the expansion slots 51, 52 and
A second edge connector 55 connected by metal traces L55 at least to one of the expansion slots 51, 52.

The edge connectors 53, 54, 55 belong to the same edge of the riser card 5 and are aligned longitudinally along the X axis.

According to one or more embodiments of the invention, the first edge connector 54 and the second edge connector 55 are spaced apart by a distance D1 greater than 8 cm. The distance D1 is for example between 9 and 11 cm, for example, equal to 10 cm. The distance D1 corresponds for example to the length of an expansion slot 51, 52.

In order to limit the length of the metal traces L54, L55 on the printed circuit board 50, the expansion slots 51, 52 are located between the first edge connector 54 and the second edge connector 55 along the X axis, for example as close as possible. In one or more embodiments, the first edge connector 54 is longer than the second edge connector 55 in order to cooperate with the first riser slot 24 which is longer and closer to the processing unit 21.

The power or side band signal edge connector 53 located next to the first edge connector 54 for example at the longitudinal extremity of the printed circuit board 50. It allows better routing and bifurcating the signal and power lanes. The first edge connector 54 is spaced apart from the power or side band signal edge connector 53 by a distance D2 comprised between 0.6 and 0.8 cm.

A process for mounting the electronic device 1 will be now described. The mother board 2 is already mounted in the housing 10 of the device 1. An operator plugs respectively, the power or side band signal edge connector 53, the first edge connector 54 and the second edge connector 55 of the riser card 5 into the power slot or side band signal slot 23, the first riser slot 24 and the second riser slot 25 of the mother board 2. The riser card 5 is mounted orthogonally to the mother board 2. In other words, the mother board 2 extends horizontally and the riser card 5 extends vertically.

The expansion slots 31, 32 are connected to the processing unit 21 by metal traces L54, L55 on the riser card 5 and by metal traces L4, L5 on the mother board 2. Thanks to the mother board 2 and to the riser card 5 of one or more embodiments of the invention, the metal traces L54, L55 are divided between the first edge connector 54 and the second edge connector 55 in order to limit the length of the metal traces on the riser card 5 but also on the mother board 2 as represented in FIG. 8.

Advantageously, the length of a metal traces between an expansion slot 31, 32 and the processing unit 21 is below 13 inches and the protocol PCIe GEN5 can be used which gives better performance. An operator can then plug the expansion cards 31, 32 similarly than in the prior art which is advantageous.

Figure 9A:
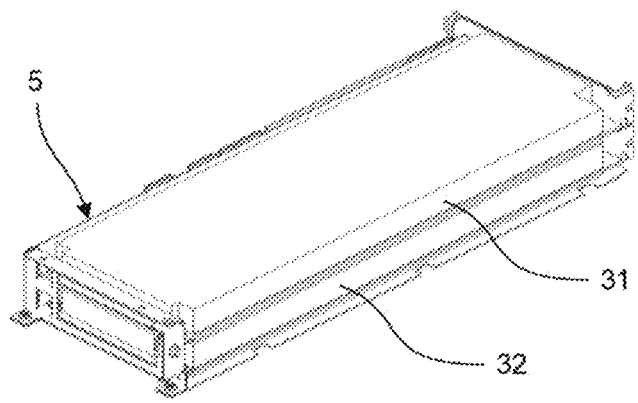
FIG. 9A, 9B, 9C represent different sort of expansion cards connected to a riser card.
Figure 9B:
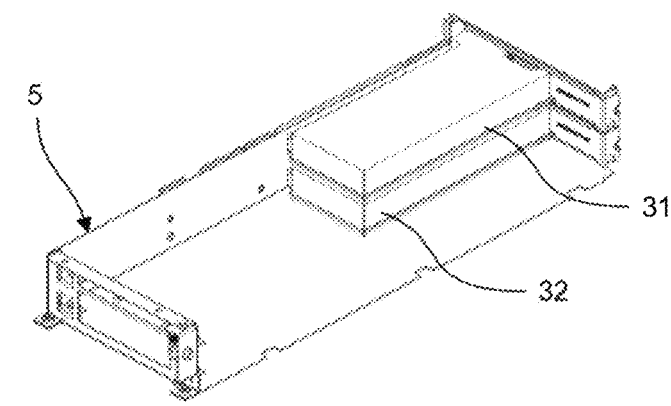
Figure 9C:
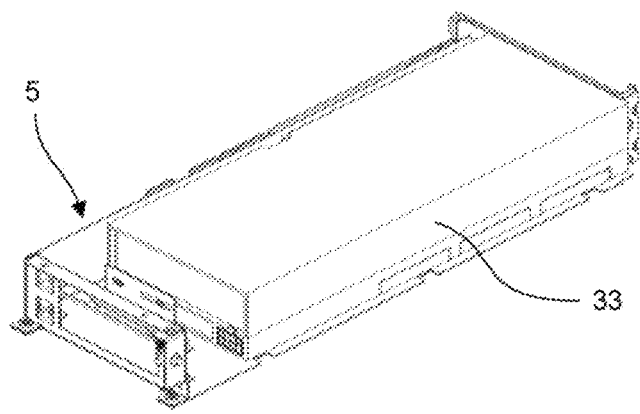

Thanks to one or more embodiments of the invention, the device 1 can support 2 FHFL expansion cards 31, 32 (Full Height Full Length) (FIG. 9A) or 2 HHHL expansion cards 31, 32 (Half Height Half Length) (FIG. 9B) or one Double width PCIe expansion cards 33 (FIG. 9C). In one or more embodiments, the height of the device 1 and the riser card 5 is 1 U.

What is claimed is:
1. An electronic device comprising:
a mother board, the mother board comprising
at least one central processing unit;
a first riser slot;
a second riser slot; and at least one memory slot located on a first side of the at least one processing unit and on a second side of the at least one processing unit, such that the first side and the second side of the at least one processing unit each comprise the at least one memory slot;

wherein
said first riser slot and said second riser slot are configured to cooperate with a riser card for connecting two expansion cards to the mother board;
the first riser slot and the second riser slot are connected by metal traces to the at least one central processing unit; and,
the first riser slot and the second riser slot are spaced apart by a first distance greater than 8 cm to limit a length of the metal traces,
said second riser slot is located at a distance from the at least one memory slot and does not require the metal traces to be routed around the at least one memory slot;

wherein the mother board further comprises a side band signal slot,
wherein the first riser slot is spaced apart from the side band signal slot by a second distance,
wherein the side band signal slot, the first riser slot and the second riser slot are configured to cooperate with said riser card, and
aligned longitudinally along an X axis from a front of the motherboard to a rear of the motherboard;
wherein the first distance between the first riser slot and the second riser slot is greater than the second distance between the first riser slot and the side band signal slot.

2. The electronic device according to claim 1, wherein the first riser slot is closer to the at least one central processing unit than the second riser slot longitudinally along said X axis, wherein the first riser slot and the second riser slot each comprise a number of pins, and wherein the number of pins of the first riser slot are more than the number of pins of the second riser slot.

3. The electronic device according to claim 2, wherein the number of the pins of the first riser slot and the number of pins of the second riser slot are predetermined in order to further limit the length of the metal traces.

4. The electronic device according to claim 1, wherein the at least one memory slot comprises a first memory slot located between the first riser slot and the at least one central processing unit.

5. The electronic device according to claim 1, wherein the second riser slot comprises less than 100 pins.

6. The electronic device according to claim 1, further comprising said riser card configured to be connected to said motherboard, wherein said riser card comprises a printed circuit board having a substantially rectangular shape extending longitudinally along an said X axis and vertically along a Z axis;
a first expansion slot configured to connect to a first expansion card;
a second expansion slot configured to connect to a second expansion card;
a first edge connector connected by first metal traces to at least one of the first expansion slot and the second expansion slot;
a second edge connector connected by second metal traces at least to one of the first expansion slot and the second expansion slot;
wherein the first edge connector and the second edge connector are spaced apart by a distance greater than 8 cm.

7. The electronic device according to claim 6, wherein the first expansion slot and the second expansion slot are located between the first edge connector and the second edge connector along the X axis.

8. The electronic device according to claim 6, wherein the first edge connector is longer than the second edge connector to cooperate with the first riser slot that is longer and closer to the at least one the processing unit compared to the second riser slot.

9. The electronic device according to claim 6, wherein said riser card further comprises a side band signal edge connector located next to the first edge connector.

10. The electronic device according to claim 9, wherein the band signal edge connector is located next to the first edge connector at a longitudinally extremity of the printed circuit board.

11. The electronic device according to claim 6, wherein the first expansion slot and the second expansion slot are aligned vertically.

12. The electronic device of claim 6, wherein the first edge connector of the riser card is plugged into the first riser slot of the mother board and the second edge connector of the riser card is plugged into the second riser slot of the mother board.

13. The electronic device according to claim 12, further comprising one or more of the first expansion card mounted in the first expansion slot and the second expansion card mounted in the second expansion slot of the riser card.

14. The electronic device according to claim 12, wherein said electronic device is configured to be mounted in a housing of a rack.

15. The electronic device according to claim 12, having a height of 1U or 2U.

16. The electronic device according to claim 1, wherein the second distance is between 0.6 cm and 0.8 cm.

* * * * *